United States Patent
Hanttangady et al.

(10) Patent No.: US 6,335,238 B1
(45) Date of Patent: Jan. 1, 2002

(54) INTEGRATED DIELECTRIC AND METHOD

(75) Inventors: Sunil V. Hanttangady, McKinney; Robert M. Wallace, Richardson; Bruce E. Gnade, Dallas; Yasutoshi Okuno, Richardson, all of TX (US)

(73) Assignee: Texas Instruments Incorporated, Dallas, TX (US)

( * ) Notice: Subject to any disclaimer, the term of this patent is extended or adjusted under 35 U.S.C. 154(b) by 0 days.

(21) Appl. No.: 09/073,087

(22) Filed: May 5, 1998

Related U.S. Application Data

(60) Provisional application No. 60/046,005, filed on May 8, 1997, and provisional application No. 60/048,806, filed on Jun. 3, 1997.

(51) Int. Cl.[7] .................. H01L 21/8242; H01L 31/0312
(52) U.S. Cl. .......................... 438/240; 438/931; 257/77
(58) Field of Search .................. 257/77; 438/240, 438/931

(56) References Cited

U.S. PATENT DOCUMENTS

| | | | |
|---|---|---|---|
| 5,206,787 A | * 4/1993 | Fujioka | ...................... 257/207 |
| 5,307,305 A | * 4/1994 | Takasu | ........................ 365/145 |
| 5,455,432 A | 10/1995 | Hartsel et al. | ................. 257/77 |
| 5,504,041 A | * 4/1996 | Summerfelt | ................ 438/396 |
| 5,973,346 A | * 10/1999 | Pan | ............................. 257/303 |
| 6,011,271 A | 1/2000 | Sakuma et al. | ............... 257/14 |

\* cited by examiner

*Primary Examiner*—Olik Chaudhuri
*Assistant Examiner*—Howard Weiss
(74) *Attorney, Agent, or Firm*—David Denker; Wade James Brady III; Frederick J. Telecky Jr.

(57) ABSTRACT

This invention pertains generally to the integration of dielectrics with integrated circuits, and more particularly to reaction barriers between high-k dielectrics and an underlying Group IV semiconductor layer. Applications for high permittivity memory cells and gate dielectrics are disclosed. This method has steps of providing a partially completed integrated circuit having a semiconductor layer substantially comprising silicon, where the layer has an exposed face. The method also includes forming an ultra-thin SiC reaction barrier at the exposed face, and depositing a high permittivity storage dielectric on the SiC reaction barrier. Typically, the SiC reaction barrier is less then 25 Å thick, preferably one or two monolayers of SiC.

25 Claims, 2 Drawing Sheets

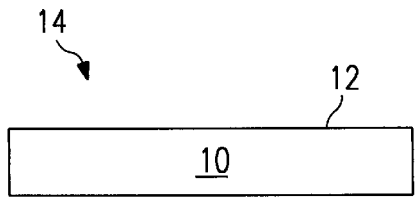
FIG. 1A
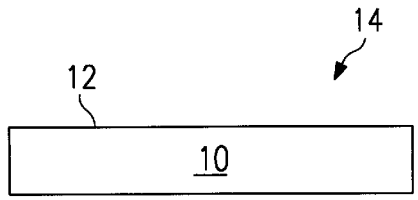
FIG. 2A
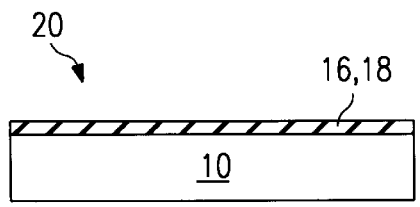
FIG. 1B
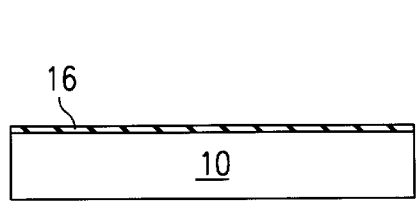
FIG. 2B
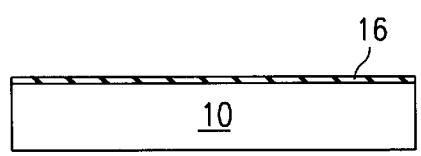
FIG. 1C
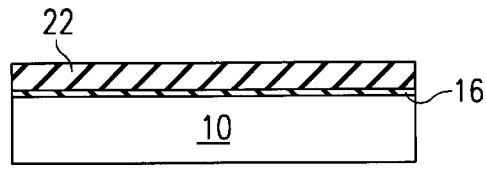
FIG. 2C
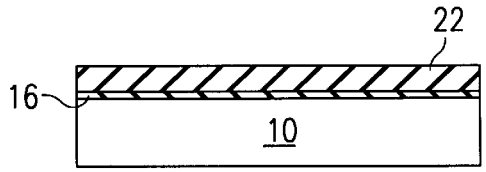
FIG. 1D
FIG. 3
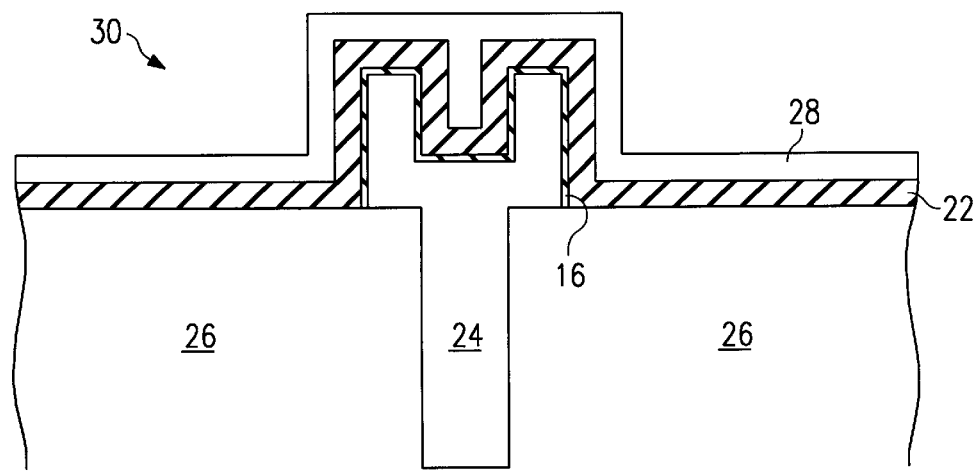

INTEGRATED DIELECTRIC AND METHOD

This application claims priority under 35 USC §119(e)(1 of provisional application No. 60/046,005 filed May 8, 1997 and No. 60/48,806 filed Jun. 3, 1997.

FIELD OF THE INVENTION

This invention pertains generally to the integration of dielectrics with integrated circuits, and more particularly to reaction barriers between high-k dielectrics and an underlying Group IV semiconductor layer.

BACKGROUND OF THE INVENTION

Semiconductors are widely used in integrated circuits for electronic devices such as computers and televisions. These integrated circuits typically combine many transistors on a single crystal silicon chip to perform complex functions and store data. Semiconductor and electronics manufacturers, as well as end users, desire integrated circuits that can accomplish more functions in less time in a smaller package while consuming less power.

Most semiconductor memories use an array of tiny capacitors to store data. One approach to expanding the capacity of a memory chip is to shrink the area of each capacitor. However, everything else being equal, a smaller area capacitor stores less charge, thereby making it more difficult to integrate into a useful memory device. One approach to shrinking the capacitor area is to change to a storage dielectric material with a higher permittivity. To the best of our knowledge, past efforts to incorporate high permittivity (high-k) materials into integrated circuits have not proven completely satisfactory.

In another, related area, one concern is the thickness of the gate dielectric used in conventional CMOS circuits. The current drive in a CMOS transistor is directly proportional to the gate capacitance. Since capacitance scales inversely with thickness, higher current drive requires continual reductions in thickness for conventional dielectrics. Present technology uses $SiO_2$ based films with thicknesses near 5 nm. However projections suggest the need for 2 nm films for future small geometry devices. $SiO_2$ gate dielectrics in this thickness regime pose considerable challenges from a manufacturing perspective. Process control of the growth of a 2 nm film requires unprecedented thickness control. At these thicknesses direct tunneling through the $SiO_2$ may occur, although the effect of tunneling current on device performance may not preclude operation. Since the tunnel current depends exponentially on the dielectric thickness, small variations in process control may result in large variations in the tunnel current, possibly leading to localized reliability problems. $SiO_2$ at these thicknesses also provides very little barrier to diffusion. Thus the diffusion of B from doped poly gates, for example, would represent an increasingly difficult problem that might also require a move to new gate dielectrics or gate metals.

The capacitance of a simple parallel plate dielectric with metal electrodes can be expressed as $$C = \epsilon \epsilon_0 A / t$$

where $\epsilon$ is the dielectric permittivity, $\epsilon_0$ so is the permittivity of free space, A is the capacitor area and t is the dielectric thickness. In general, the increase in capacitance density (C/A) required for increasing current drive can be accomplished either by decreasing the dielectric thickness t or by increasing the dielectric permittivity $\epsilon$ of the material. Thus, as with storage dielectrics, it is again desirable to change to a material with a higher permittivity.

SUMMARY OF THE INVENTION

Although dielectric permittivity is often referred to as the dielectric "constant" k, it is not a constant and may show strong variations with frequency, electric field or temperature. The magnitude of each of the dielectric mechanisms, as well as the speed with which they respond to changes in the applied field will vary. The space charge and dipole components show strong variations at frequencies of a few MHz and below. The ionic component is relatively constant for values well into the GHz region, while at optical frequencies the only remaining component is the electronic polarization. Consideration of these phenomena initially suggests that either ionic or electronic mechanisms may be preferred in high permittivity dielectrics for memory capacitors and gate dielectrics. Although most high permittivity dielectrics have dielectric constants greater than 50, some potentially useful dielectrics have lower permittivity. Thus, for the purposes of this application, high permittivity dielectrics will have dielectric constants greater than or equal to about 20.

This preference for dielectric mechanisms with high frequency response somewhat limits the field of practical high permittivity dielectric materials. This class of materials includes $Ta_2O_5$; $Nb_2O_3$; $Y_2O_3$; $TiO_2$; $(Ta_2O_5)_9$, $(TiO_2)_1$; $ZrO_2$; $HfO_2$; $(Hf,Zr)O_2$; $BaTiO_3$; $SrTiO_3$; and $(Ba,Sr)TiO_3$ or BST. Even though some of these may be considered ferroelectric materials, each of these materials shows promise as a high-k dielectric.

This disclosure will focus on high-k dielectrics. However, many devices will provide suitable performance with elevated dielectric constant (k>7) materials such as $Al_2O_3$ and $Si_3N_4$, and limited frequency response materials such as lead zirconate titanate (PZT). If performance requirements are satisfied, these dielectrics may be substituted for the high-k dielectrics in the examples below.

The semiconductor industry has tried for several years to integrate high permittivity (high-k) materials into integrated circuits. Although there has been much progress, these prior approaches each have drawbacks or limitations. One recurring problem is preventing unwanted layers from forming between the substrate or first electrode and the high-k dielectric. Unless these layers also have a high permittivity, the overall capacitance is reduced. This can be shown clearly with an illustrative example. For this example, we will use one promising high-k dielectric candidate, $Ta_2O_5$ on a silicon layer. Other high-k materials will have different interface details, but will follow the same general analysis.

$Ta_2O_5$ has a promising permittivity and reasonable bandgap. However, the lower heat of formation relative to $SiO_2$ immediately suggests that $Ta_2O_5$ is not thermodynamically stable next to Si and will decompose to $SiO_2$ at the interface. The capacitance of 2 dielectrics in series (such as a $Ta_2O_5$ dielectric layer on an interfacial $SiO_2$ layer) is given by $$(1/C) = (1/C_1) + (1/C_2)$$

where $C_1$ and $C_2$ are the capacitances of the two layers. From equation 1 we can write (assuming equal area capacitors)

$$t/\epsilon = t_1/\epsilon_1 + t_2/\epsilon_2$$

where $t_1$, $t_2$ represent the thicknesses of the two layers, $\epsilon_1, \epsilon_2$ represent the permittivities of the two layers, and t and $\epsilon$ are the "effective" thickness and permittivity of the stack.

A common parameter used to describe dielectric stacks is the equivalent oxide thickness of the capacitor. This is the theoretical thickness of $SiO_2$ that would be necessary to generate the same capacitance density as the material of interest (ignoring practical issues with thin $SiO_2$ films such as leakage or tunneling effects). Thus, $$t_{eq}(SiO2)=\epsilon(SiO_2)*[t_1/\epsilon_1+t_2/\epsilon_2]$$

If the interfacial layer $t_1$ is $SiO_2$, this equation can be rewritten as:

$$t_{eq}(SiO_2)=t_1+t_2*[\epsilon(SiO_2)/\epsilon_2]$$

This equation shows that the equivalent (effective) oxide thickness of the stack (and hence the capacitance density) will be limited by the presence of a thin interfacial oxide. Thus, the effective oxide thickness will never be less than the thickness of the interfacial oxide. This minimum effective thickness is independent of the permittivity and thickness of the second layer. This finding is consistent with the extensive body of work performed to try to develop $Ta_2O_5$ as a DRAM dielectric. According to Aoyama, in "Leakage current mechanism of amorphous and polycrystalline $Ta_2O_5$ films grown by chemical vapor deposition." *J. of Electrochemical Society,* 1996. 143(3): p. 977–983, the minimum effective oxide thickness achievable with $Ta_2O_5$ MIS capacitor structures using Si based electrodes is ~2.5 nm. This is due to the presence of an interfacial oxide formed during the $Ta_2O_5$ deposition and/or crystallization anneal steps. Various processes have been attempted to control the nature of the interface between Si and $Ta_2O_5$, including strategies for using $N_2O$ to nitride the Si surface before $Ta_2O_5$ deposition. In all cases to date, however, the capacitance density has been limited by the unwanted presence of an $SiO_2$ layer at the interface. The lower equivalent oxide thickness of 0.7 nm achieved using $Ta_2O_5$ with metal electrodes (see Aoyama, T.e.a. "Characteristics of thin film $Ta_2O_5$ capacitors with Ru bottom electrode." in 43*rd spring meeting of the Japanese Society of Applied Physics.* 1996. Univ. of Tokyo, Japan.) indicates the potential capacitance available if interfacial oxide could be removed. The presence of the interfacial oxide is the dominant difficulty in implementing oxide based dielectrics on Si.

To keep the equivalent thickness low, we have given up the approach of eliminating an interfacial layer. Instead, we form an ultra-thin (such as a monolayer), thermodynamically stable interfacial layer of SiC. This SiC layer acts as a reaction barrier to prevent the formation of a thick $SiO_2$ layer at the interface. This SiC monolayer may add to the overall equivalent oxide thickness. However, this ultra-thin layer will give very little contribution. This deceptively simple approach also has other advantages. SiC's very stable nature allows its use as a reaction barrier with many high-k dielectrics. SiC deposition is highly conformal and more or less self-terminating, while excess carbon is easily removed. Ultra-thin SiC formation is simple to implement in the manufacturing environment and compatible with existing equipment. When used in conjunction with rugged (textured) polysilicon, the Si—C bonds at the grain boundaries help to prevent the polysilicon grains from coalescing during subsequent processing.

The Si—C reaction has been extensively studied and researchers have used bulk SiC as a semiconductive material. However, this is apparently the first time that anyone has taught the use of an SiC monolayer as a reaction barrier between an oxygen rich dielectric and a silicon layer. This novelty comes in spite of a long-felt need in the semiconductor industry for an effective method to connect silicon to dielectrics (often through an intermediate electrode) that either react with silicon or oxidize silicon. This area has been extensively researched with numerous techniques patented and papers published over the last 10 years. This invention's novelty can possibly be explained by the fact that most semiconductor production facilities generally regard carbon as a contaminant. They especially avoid forming SiC surface films, due to the difficulty of removing a SiC film from a silicon surface. Additionally, the process for forming bulk SiC is not well suited to forming ultra-thin SiC films.

A method of forming a memory cell in an integrated circuit is disclosed. This method comprises providing a partially completed integrated circuit having a semiconductor layer substantially comprising silicon, where the layer has an exposed face. The method further comprises forming an ultra-thin SiC reaction barrier at the exposed face, and depositing a storage dielectric on the SiC reaction barrier. The method further comprises forming a memory cell comprising the storage dielectric. In some embodiments, this method also comprises removing unreacted carbon by annealing in an oxygen-containing atmosphere after forming the SiC reaction barrier and before depositing the storage dielectric. Typically, the SiC reaction barrier is less than 25 Å thick, preferably one or two monolayers of SiC. Preferably, the storage dielectric is a high-k material, perhaps containing oxygen. Some suitable storage dielectrics include $CeO_2$; $Al_2O_3$; $Si_3N_4$; $Nb_2O_3$; $Y_2O_3$; $TiO_2$; $(Ta_2O_5)_9$, $(TiO_2)_1$; $ZrO_2$; $HfO_2$; $BaTiO_3$; $SrTiO_3$; BST; and PZT. In some embodiments, such as trench capacitors and stack capacitors, the underlying semiconductor layer is not substantially flat.

A method of forming a MIS field-effect transistor (FET) structure in an integrated circuit is also disclosed. This method comprises providing a partially completed integrated circuit having a silicon layer with an exposed face and forming an ultra-thin SiC reaction barrier at the exposed face. The method further comprises depositing a gate dielectric on the SiC reaction barrier, forming a gate electrode on the gate dielectric, and forming a FET comprising the gate dielectric.

BRIEF DESCRIPTION OF THE DRAWINGS

FIG. 1 shows a method for depositing dielectrics.

FIG. 2 shows a method for depositing dielectrics.

FIG. 3 shows a stack capacitor using an ultrathin SiC layer between the silicon and the storage dielectric.

DETAILED DESCRIPTION

Figure 4:
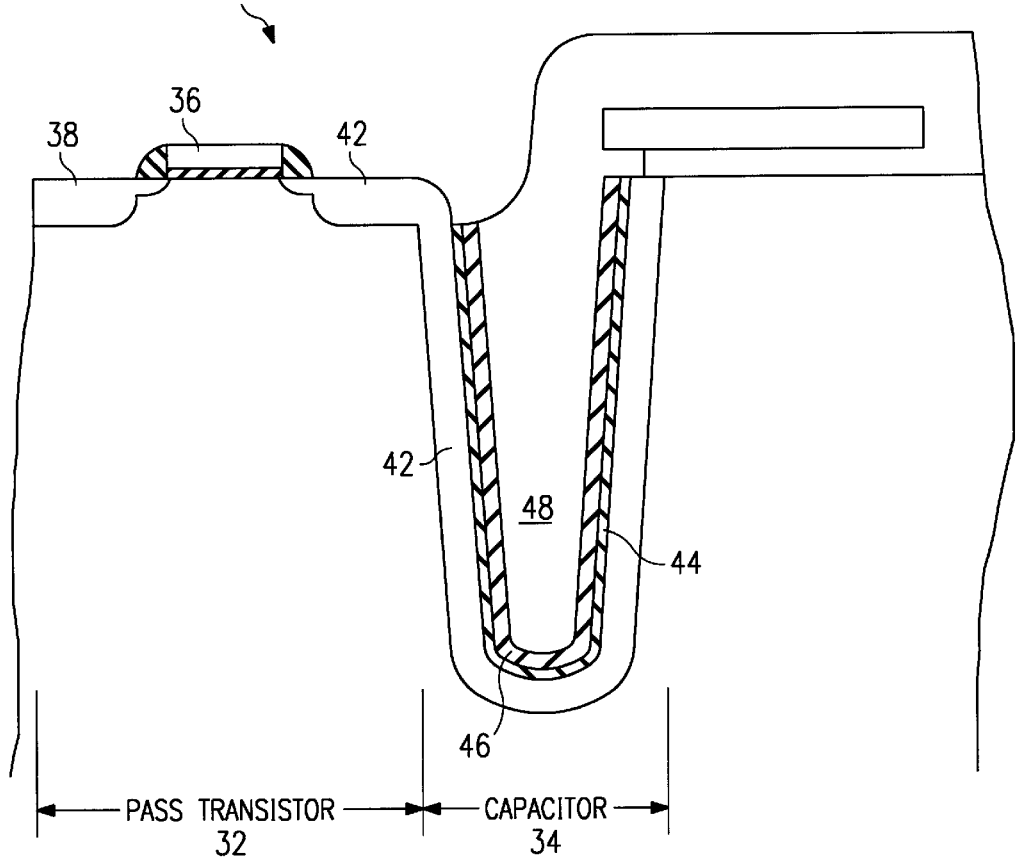
FIG. 4 shows a DRAM cell comprising a trench capacitor comprising an ultrathin SiC layer between the silicon and the storage dielectric.

FIG. 1 outlines a method of using this invention to form a dielectric on a silicon substrate. Initially, a clean Si substrate 10 is provided. Typically, this substrate 10 will comprise a partially completed integrated circuit. For most applications, a hydrogen passivated (such as by HF wet preparation) surface 12 provides sufficient cleanliness. The hydrogen should be desorbed, preferably in a vacuum, before formation of the ultra-thin SiC layer. Although this desorption is not required to form SiC, the Si—C reaction occurs more quickly and evenly on a clean Si surface. The Si surface 12 is then exposed to a carbon source such as acetylene ($C_2H_2$) 14. Other carbon sources without oxygen, such as methane ($CH_4$) ethylene ($C_2H_6$), etc. will also work. The $C_2H_2$ 14 will react with the dangling bonds on the silicon surface 12 to form SiC. However, since the only source of silicon is the surface, the reaction will nearly terminate when the Si surface is covered with a SiC monolayer 16. With this SiC cap layer 16, there is little diffusion of carbon into the silicon substrate 10. This dramatic slowing of the reaction provides time to halt the reaction before a thick layer forms. With clean silicon, this acetylene/silicon reaction will take place at a wide variety of temperatures, including nearly down to liquid nitrogen temperatures. This flexibility allows allowing artisans to easily integrate this process into different process flows. Since reaction temperatures above 500 degrees C. tend to result in carbon penetration, it may be preferable to react below 300 to 400 degrees C. However, reaction temperatures between –25 degrees C. and 80 degrees C. are easy to work with and also allow good process control. In some embodiments, the ultra-thin SiC reaction barrier can be formed at temperatures below about 350 degrees C.—including temperatures between about 0 degrees C. and 60 degrees C. If excess carbon 18 is present after this carbonization, it is preferable to anneal the device in an oxygen-containing atmosphere 20. This oxygen anneal will react with any free carbon 18 to form $CO_2$, which can be easily removed from the reaction chamber. After this oxygen anneal, a high permittivity dielectric layer 22, such as $Ta_2O_5$, is formed on the SiC reaction barrier 16. The typical $Ta_2O_5$ process requires a post-deposition oxygen anneal. This can be a high temperature $O_2$ anneal or an $O_2$ plasma anneal, or some other excited oxygen anneal. Without the SiC layer, this anneal would form a thick $SiO_2$ interfacial layer between the $Ta_2O_5$ and the substrate, significantly reducing the capacitance. FIG. 2 shows that the post-carbonization anneal step may preferably be omitted, if no excess carbon remains on the SiC surface 16.

FIG. 3 shows a stack capacitor embodiment of this invention. Stack capacitors are often used in integrated circuits, including DRAMs. The stack capacitor 30 comprises a conductive polysilicon lower electrode 24 partially encased in an insulating dielectric 26. In many embodiments, the insulating dielectric 26 comprises $SiO_2$, and the electrode surface above the insulating dielectric 26 (the exposed surface) is formed from rugged polysilicon. The term "rugged" polysilicon, as used herein, applies to silicon layers or structures that undulate in a manner such that the surface area is significantly increased, including layers and structures that are "roughened" by grain boundary etching and direct deposition of polysilicon having a hemispherical grain structure. This example shows a forked structure. Other stack capacitor geometries include double-stacked, fin-structured, cylindrical, spread-stacked, and box structured capacitors. A SiC monolayer 16 forms a reaction barrier over this exposed surface of electrode 24. High permittivity dielectric layer 22 covers the exposed surface of electrode 24, but does not form a thick $SiO_2$ layer at the interface, due to the ultra-thin SiC layer 16. Two suitable materials for high-k layer 22 include $Ta_2O_5$ and BST. In some embodiments, dielectric layer 22 is not required to have a high permittivity. In these cases, the storage dielectric can comprise an elevated permittivity dielectric 22, such as $Al_2O_3$. Upper electrode 28 covers the storage dielectric 22 to form stack capacitor 30. Suitable materials for the upper electrode include titanium nitride, tungsten, molybdenum, tantalum, compounds including these, and combinations thereof. In some embodiments, dielectric layer 22 and upper electrode 28 cover not only the exposed surface of lower electrode 24, but may also extend to cover substantial portions of insulator 26.

FIG. 4 shows a DRAM cell comprising a trench capacitor embodiment of this invention. Those skilled in the art will quickly recognize that this process is also compatible with other types of DRAM cells, as well as other trench configurations. DRAM cell 40 comprises two principal regions, a pass transistor 32 and a storage capacitor 34. Pass transistor 32 comprises polysilicon gate 36, n+ Si bit line 38, and n+ Si storage node 42. Polysilicon gate 36 is connected to the DRAM word line and storage node 42 forms the outer electrode 42 of storage capacitor 34.

Storage capacitor 34 comprises storage electrode 42, ultra-thin SiC layer 44, high permittivity storage dielectric 46, and inner electrode 48. As discussed above, storage electrode 42 comprises n+ Si. The ultra-thin layer of SiC 44 is formed by exposing the clean, silicon outer electrode 42 to a carbonaceous gas, such as acetylene. If excess carbon forms, then applying a post-carbonization oxygen anneal to the integrated circuit will remove the unreacted carbon. High permittivity storage dielectric 46 may comprise $Ta_2O_5$. The typical $Ta_2O_5$ process requires a post-deposition oxygen anneal. Without the SiC layer 44, this anneal would form a thick $SiO_2$ interfacial layer between the $Ta_2O_5$ and the substrate, significantly reducing the capacitance of storage capacitor 34. Inner electrode 48 provides electrical contact to the top surface of storage dielectric 46. This inner electrode 48 could comprise polysilicon. However, with an oxygen containing high-k dielectric, great care must be taken to prevent formation of a thick $SiO_2$ interlayer between the high-k dielectric and the polysilicon. Instead, inner electrode 48 preferably comprises a metal alloy or metal, such as TiN or a tungsten-based conductor.

Figure 5:
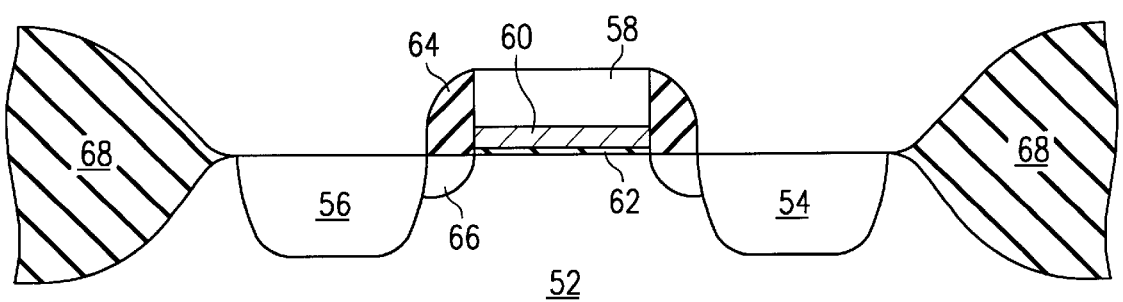
FIG. 5 shows a field-effect transistor comprising an ultrathin SiC layer between the silicon and the gate dielectric.

FIG. 5 shows a metal-insulator-silicon field-effect transistor (MISFET) embodiment of this invention. Field-effect transistor 50 has four principal parts: a substrate 52, a source 54, a drain 56, and a gate, where the gate includes the gate electrode 58 and high permittivity gate dielectric 60. For a NMOS transistor 50, p-type silicon substrate 52 contains n+ source 54 and n+ drain 56 regions. A SiC monolayer 62 forms a reaction barrier between silicon substrate 52 and high permittivity gate dielectric 60. Gate dielectric 60 may be formed from one of a number of high-k materials, such as $Ta_2O_5$. If $Ta_2O_5$ is used, the SiC reaction barrier 62 prevents a thick $SiO_2$ interlayer from forming at the Si—$Ta_2C_5$, interface. As discussed above, a high-k gate dielectric allows a low equivalent oxide thickness, with a thicker physical thickness. With an oxygen-rich high-k gate dielectric, such as $Ta_2O_5$, it is preferable to form the gate electrode 58 from a metal, such as TiN or tungsten. MIS FET transistor 50 also includes sidewall spacers 64, lightly doped drain (LDD) region 66, and isolation region 68. Those skilled in the art will recognize that these and other features may be used or left out, depending upon the particular function of the device and the intended processing flow.

These examples have shown NMOS transistors. Since the Si—C reaction is substantially insensitive to the doping profile of Si, no special modifications are required to implement this invention in PMOS devices. This disclosure has concentrated on SiC reaction barriers on Si substrates and Si underlayers. However, a carbide interlayer also works as a reaction barrier for germanium, and other group IV materials. Thus, for a Ge substrate, an ultra-thin GeC layer can be formed in a similar manner to the SiC layers discussed above. Other group IV materials should show similar behavior. This also applies to alloys of group IV materials, particularly Si—Ge alloys. The limited exposure of a clean, Si—Ge alloy surface to acetylene will form an ultra-thin layer of SiC/GeC. This SiC/GeC layer can also be used as a reaction barrier.

This disclosure discusses forming a monolayer of SiC (or GeC, etc.) on the underlying layer. However, slightly thicker SiC layers, such as two or so monolayers, provide slightly greater margin against forming $SiO_2$ or silicides at the interface, while costing only a slight operating performance decrease. Thus, it is not always necessary to take great care that the SiC layer remains a monolayer. As long as the SiC layer remains ultra-thin (less than about 20 Å), performance losses should be acceptable for many applications.

This disclosure uses $Ta_2O_5$ as the high permittivity dielectric in the examples. $Ta_2O_5$ is currently one of the most promising high-k dielectrics. However, the SiC reaction barrier can be used with many of the other elevated and high permittivity dielectrics available. These include, but are not limited to, $CeO_2$; $Al_2O_3$; $Si_3N_4$; $Nb_2O_3$; $Y_2O_3$; $TiO_2$; $(Ta_2O_5)_9$, $(TiO_2)$; $ZrO_2$; $HfO_2$; $BaTiO_3$; $(Ba,Sr)TiO_3$ or BST; and lead zirconate titanate (PZT) Most of these dielectrics suffer from the same Si interface problem as $Ta_2O_5$. That is, that during or after their deposition, they form a substantially nonconductive interlayer between the dielectric and the underlying Si. In most cases, this interlayer is $SiO_2$. In some cases, the interlayer is a silicide. It is likely that this approach will also apply to between the dielectric and the underlying Si. In most cases, this interlayer is $SiO_2$. In some cases, the interlayer is a silicide. It is likely that this approach will also apply to some of the new high permittivity dielectrics being developed, including high permittivity organic dielectrics.

Although the present invention has been described with several sample embodiments, various changes and modifications may be suggested to one skilled in the art. It is intended that the present invention encompass such changes and modifications as fall within the scope of the appended claims.

We claim:

1. A method of forming a memory cell in an integrated circuit, comprising:
   providing a partially completed integrated circuit having a semiconductor layer substantially comprising silicon, the layer having an at least partially exposed face;
   forming an ultra-thin SiC reaction barrier at the exposed face;
   depositing a storage dielectric on the SiC reaction barrier; and
   forming a memory cell comprising the storage dielectric.

2. The method of claim 1, further comprising removing unreacted carbon by annealing in an oxygen-containing atmosphere after forming the SiC reaction barrier and before depositing the storage dielectric.

3. The method of claim 1, wherein the SiC reaction barrier does not exceed two monolayers of SiC.

4. The method of claim 1, wherein the SiC reaction barrier is substantially a monolayer of SiC.

5. The method of claim 1, wherein forming an ultra-thin SiC reaction barrier comprises contacting the exposed face with a carbonaceous gas.

6. The method of claim 5, wherein the carbonaceous gas is selected from the group consisting of acetylene, ethylene, and methane.

7. The method of claim 5, wherein the forming an ultra-thin SiC reaction barrier occurs within a temperature range below about 350 degrees C.

8. The method of claim 5, wherein the forming an ultra-thin SiC reaction barrier occurs within a temperature range between about 0 degrees C. and 60 degrees C.

9. The method of claim 1, wherein the storage dielectric comprises a material selected from the group consisting of elevated permittivity materials and high permittivity materials.

10. The method of claim 1, wherein the storage dielectric comprises a dielectric material containing oxygen.

11. The method of claim 1, wherein the storage dielectric comprises $Ta_2O_5$.

12. The method of claim 1, wherein the storage dielectric comprises a dielectric selected from the group consisting of $Ta_2O_5$, $BaTiO_3$, BST, $Al_2O_3$, and $CeO_2$.

13. The method of claim 1, wherein the storage dielectric comprises a dielectric selected from the group consisting of $CeO_2$; $Al_2O_3$; $Si_3N_4$; $Nb_2O_3$; $Y_2O_3$; $TiO_2$; $(Ta_2O_5)_9$, $(TiO_2)_1$; $ZrO_2$; $HfO_2$; $BaTiO_3$; $SrTiO_3$; BST; and PZT.

14. The method of claim 1, wherein the semiconductor layer comprises a material selected from the group consisting of elemental silicon, single crystal silicon, poly-crystalline silicon, rugged poly-crystalline silicon, and amorphous silicon.

15. The method of claim 1, wherein the memory cell is part of a DRAM.

16. The method of claim 1, wherein the semiconductor layer is not substantially flat.

17. The method of claim 16, wherein the memory device comprises a stack capacitor.

18. The method of claim 16, wherein the memory device comprises a trench capacitor.

19. A method of forming a MIS FET structure in an integrated circuit, comprising:
   providing a partially completed integrated circuit having a silicon layer with an exposed face;
   forming an ultra-thin SiC reaction barrier at the exposed face;
   depositing a gate dielectric on the SiC reaction barrier;
   forming a gate electrode on the gate dielectric; and
   forming a FET comprising the gate dielectric.

20. A method of forming a memory cell in an integrated circuit, comprising:
   providing a partially completed integrated circuit having a semiconductor layer comprising germanium, the layer having an exposed face;
   forming an ultra-thin reaction barrier comprising GeC at the exposed face;
   depositing a storage dielectric on the reaction barrier; and
   forming a memory cell comprising the storage dielectric.

21. A method of forming a memory cell in an integrated circuit, comprising:
   providing a partially completed integrated circuit having a semiconductor layer comprising a Si—Ge alloy, the layer having an exposed face;
   forming an ultra-thin reaction barrier comprising GeC and SiC at the exposed face;
   depositing a storage dielectric on the reaction barrier; and
   forming a memory cell comprising the storage dielectric.

22. A method of forming a memory cell in an integrated circuit, comprising:
   providing a partially completed integrated circuit having a semiconductor layer substantially comprising silicon, the layer having an at least partially exposed face;
   forming a SiC reaction barrier at the exposed face, the SiC reaction barrier less than 25 Å thick;

depositing a storage dielectric on the SiC reaction barrier; and forming a memory cell comprising the storage dielectric.

23. A method of forming a MIS FET structure in an integrated circuit, comprising:

providing a partially completed integrated circuit having a silicon layer with an exposed face;

forming a SiC reaction barrier at the exposed face, the SiC reaction barrier less than 25 Å thick;

depositing a gate dielectric on the SiC reaction barrier;

forming a gate electrode on the gate dielectric; and forming a FET comprising the gate dielectric.

24. The method of claim 5, wherein the forming an ultra-thin SiC reaction barrier occurs within a temperature range below 400 degrees C.

25. The method of claim 5, wherein the forming an ultra-thin SiC reaction barrier occurs within a temperature range between −25 degrees C. and 80 degrees C.

* * * * *

UNITED STATES PATENT AND TRADEMARK OFFICE
CERTIFICATE OF CORRECTION

PATENT NO. : 6,335,238 B1
DATED : January 1, 2002
INVENTOR(S) : Sunil V. Hattangady, Robert M. Wallace, Bruce E. Gnade and Yasutoshi Okuno It is certified that error appears in the above-identified patent and that said Letters Patent is hereby corrected as shown below:

<u>Title page,</u>
Item [75], Inventors, change "Sunil V. Hanttangady" to -- Sunil V. Hattangady --
Item [12], Inventors, change "Sunil V. Hanttangady" to -- Sunil V. Hattangady --

Signed and Sealed this

Sixth Day of August, 2002

*Attest:*

JAMES E. ROGAN
*Attesting Officer*   *Director of the United States Patent and Trademark Office*